US007728511B2

United States Patent
Shin et al.

(10) Patent No.: US 7,728,511 B2
(45) Date of Patent: Jun. 1, 2010

(54) ORGANIC THIN FILM TRANSISTOR, METHOD OF MANUFACTURING THE SAME, AND FLAT DISPLAY APPARATUS COMPRISING THE SAME

(75) Inventors: Hyun-Soo Shin, Suwon-si (KR); Min-Chul Suh, Suwon-si (KR); Yeon-Gon Mo, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 690 days.

(21) Appl. No.: 11/603,362

(22) Filed: Nov. 21, 2006

(65) Prior Publication Data

US 2007/0114920 A1 May 24, 2007

(30) Foreign Application Priority Data

Nov. 22, 2005 (KR) .................. 10-2005-0111989

(51) Int. Cl.
    *H01J 63/04* (2006.01)
(52) U.S. Cl. ....................................... 313/504
(58) Field of Classification Search ................ 313/504; 445/24
    See application file for complete search history.

(56) References Cited

U.S. PATENT DOCUMENTS

| 5,719,033 | A  | * | 2/1998  | Ackley et al. ............. 435/7.92 |
| 6,019,796 | A  | * | 2/2000  | Mei et al. ................... 438/151 |
| 6,480,577 | B1 | * | 11/2002 | Izumi et al. ................. 379/40 |
| 6,770,904 | B2 | * | 8/2004  | Ong et al. ................... 257/40 |
| 6,933,529 | B2 | * | 8/2005  | Yoo et al. ................... 257/59 |
| 2001/0030324 | A1 | * | 10/2001 | Morikawa et al. ......... 257/59 |
| 2005/0236629 | A1 |   | 10/2005 | Lee et al. |

* cited by examiner

*Primary Examiner*—Joseph L Williams
*Assistant Examiner*—Hana A Sanei
(74) *Attorney, Agent, or Firm*—Christie, Parker & Hale, LLP

(57) ABSTRACT

An organic thin film transistor (TFT), a method of manufacturing the organic TFT, and a flat display apparatus having the organic TFT are provided. The organic TFT has a gate insulating layer with openings filled with a conductive material, thereby preventing short circuits from occurring between channels connecting the source and drain lines to the organic semiconductor layer. The organic TFT includes a substrate including a source line, a drain line, and a gate electrode. The organic TFT further includes a gate insulating layer formed on the source and drain lines and on the gate electrode. The gate insulating layer has openings exposing the source and drain lines, which openings are filled with a conductive material. The organic TFT also includes an organic semiconductor layer electrically connected to the conductive material.

23 Claims, 3 Drawing Sheets

ORGANIC THIN FILM TRANSISTOR, METHOD OF MANUFACTURING THE SAME, AND FLAT DISPLAY APPARATUS COMPRISING THE SAME

CROSS-REFERENCE TO RELATED PATENT APPLICATION

This application claims priority to and the benefit of Korean Patent Application No. 10-2005-0111989, filed on Nov. 22, 2005, in the Korean Intellectual Property Office, the entire content of which is incorporated herein by reference.

BACKGROUND OF THE INVENTION

1. Field of the Invention

The present invention relates to an organic thin film transistor, a method of manufacturing the same, and a flat display apparatus comprising the same. More particularly, the invention relates to an organic thin film transistor having a conductive material in an opening patterned in a gate insulating layer, which prevents short circuits from occurring between the channel connecting source and drain lines and the organic semiconductor.

2. Description of the Related Art

Thin film transistors (TFTs) are used in flat display apparatuses such as liquid crystal display devices, organic field emission display devices, and inorganic field emission display devices. The TFTs are used as switching devices that control the operation of each pixel and as driving devices that drive the pixels.

A conventional TFT is depicted in FIG. 1 and includes a gate electrode 20, source and drain lines 30a and 30b formed parallel to each other on a substrate 10, a gate insulating film 40 formed on the gate electrode 20 and on the source and drain lines 30a and 30b, an organic semiconductor layer 50 formed on the gate insulating film 40, tapers 60a and 60b formed in the gate insulating film 40, and source and drain electrodes 80a and 80b electrically connecting the source and drain lines 30a and 30b to the organic semiconductor layer 50.

Conventionally, if the gate insulating film 40 is formed of an organic material or an organic-inorganic hybrid type material, the TFT exhibits a large gate leakage current. Therefore, the gate insulating film 40 should be thick (i.e. from 0.5 to 1.0 µm). However, when contact holes 61a and 61b (which connect the source and drain electrodes to the pad metal or connect the source and drain electrodes to the pixel electrodes) are formed by dry etching, the angle of the tapers 60a and 60b is greater than 70 degrees. A channel is formed by dry etching the gate insulating film 40. The source and drain electrodes 80a and 80b are formed of a metal having a high work function, such as Au, Pt, Pd, etc. The source and drain lines 30a and 30b are then connected to the organic semiconductor layer 50. However, the metal having a high work function has a weak binding force with the underlying material. Therefore, it is difficult to form the source and drain electrodes 80a and 80b thicker than about 1000 Å. Due to the characteristics of metals having high work functions and their working processes, there is a high possibility that the channels formed on the slopes of the tapers 60a and 60b are too thin or disconnected.

SUMMARY OF THE INVENTION

In one embodiment of the present invention, an organic thin film transistor (TFT) can prevent short circuits from occurring between a channel connecting the source and drain lines to the organic semiconductor.

In another embodiment, the TFT comprises a conductive material in an opening patterned in a gate insulating layer.

In yet another embodiment, a method of manufacturing the organic TFT is provided.

In still another embodiment, a flat display apparatus comprising the organic TFT is provided.

According to one embodiment of the present invention, an organic TFT comprises a source line, a drain line, and a gate electrode formed on a substrate. In addition, a gate insulating layer is formed on the source and drain lines and on the gate electrode. The gate insulating layer has openings that expose the source and drain lines. The TFT further comprises a conductive material that contacts the source and drain lines through the openings, and an organic semiconductor layer electrically connected to the conductive material.

According to another embodiment of the present invention, a method of manufacturing an organic TFT comprises forming source and drain lines and a gate electrode on a substrate. A gate insulating layer comprising patterned openings exposing the source and drain lines, is then formed on the source and drain lines and on the gate electrode. The patterned openings are filled with a conductive material so that the source and drain lines can contact the source and drain electrodes through the openings. An organic semiconductor layer is electrically connected to the conductive material.

According to yet another embodiment of the present invention, a flat display apparatus comprises an organic TFT comprising a source line, a drain line, and a gate electrode formed on a substrate. The TFT further includes a gate insulating layer formed on the source and drain lines and on the gate electrode. The gate insulating layer has patterned openings that expose the source and drain lines. The TFT also comprises a conductive material in the patterned openings, which conductive material contacts the source and drain lines. An organic semiconductor layer is electrically connected to the conductive material. The flat display apparatus comprises a display device electrically connected to the organic thin film transistor.

BRIEF DESCRIPTION OF THE DRAWINGS

The above and other features and advantages of the present invention will become more apparent with reference to the following detailed description when considered in conjunction with the accompanying drawings in which.

DETAILED DESCRIPTION OF THE INVENTION

Figure 1:
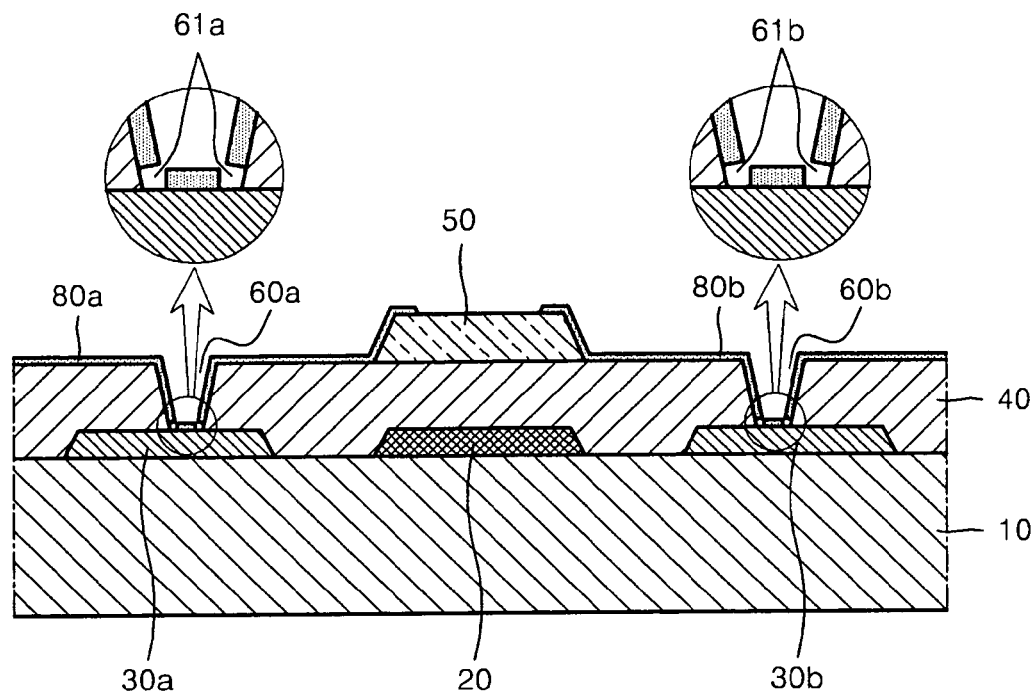
FIG. 1 is a cross-sectional view of a prior art organic TFT.
Figure 2:
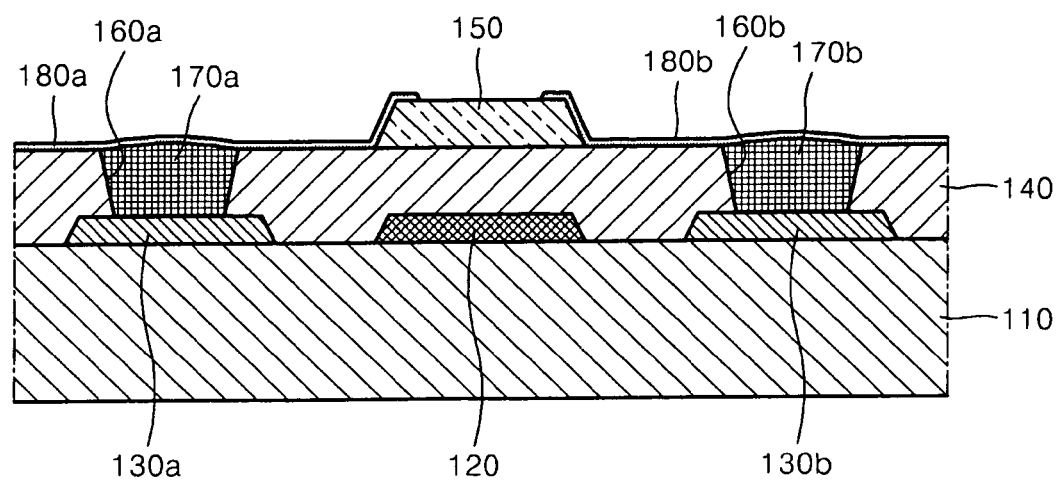
FIG. 2 is a cross-sectional view of an organic TFT according to one embodiment of the present invention.

FIG. 2 is a cross-sectional view of an organic TFT according to one embodiment of the present invention. As shown in FIG. 2, a gate electrode 120 and source and drain lines 130a and 130b are formed on a substrate 110. The gate electrode 120 and the source and drain lines 130a and 130b can each comprise the same material or may comprise different materials.

Nonlimiting examples of suitable materials for use as the substrate 110 include plastics such as acryl, polyimide, polyester, and mylar. Other nonlimiting examples of suitable materials for the substrate 110 include glass, and metal foils such as SUS and tungsten. The substrate 110 may be flexible.

Nonlimiting examples of suitable materials for use as the gate electrode 120 include conductive materials such as MoW, Al, Cr, Al/Cr, etc. Other nonlimiting examples of suitable materials for the gate electrode 120 include conductive polymers such as conductive polyaniline, conductive polypyrrole, conductive polythiophene, conductive polyethylene dioxythiophene ("PEDOT"), and polystyrene sulfonic acid. The material for the gate electrode 120 should be selected in consideration of its adherence to the substrate 110, the planarity of thin films formed on the upper part of the gate electrode 120, processability for patterning, and resistance to chemicals used in subsequent processes.

A gate insulating layer 140 is formed after formation of the gate electrode 120 and the source and drain lines 130a and 130b. In one embodiment, the gate insulating layer 140 is an inorganic insulating layer comprising $SiO_2$, SiNx, $Al_2O_3$, $Ta_2O_5$, BST, PZT, etc. and is formed, for example, by chemical vapor deposition (CVD) or sputtering. In another embodiment, the gate insulating layer 120 is an organic insulating layer comprising a polymer material such as polymers having an imide group, a phenol group, an acryl group, an arylether group, an amide group, a fluorine group, a p-xylene group, a vinylalcohol group, and a parylene group. Nonlimiting examples of suitable polymers having an imide group include polymethylmethacrylate (PMMA) and polystyrene (PS).

The gate insulating layer 140 can have various configurations. For example, the gate insulating layer 140 may have multiple layers consisting of organic insulating layers and inorganic layers. In one exemplary embodiment, the gate insulating layer 140 may be formed of a material having a high dielectric constant as well as having insulating characteristics and having an expansion coefficient similar or equal to that of the substrate. In the present embodiment, the gate insulating layer 140 is a hybrid type, in which an organic material and an inorganic material are mixed by spin coating.

After the gate insulating layer 140 is formed, openings 160a and 160b are formed in the gate insulating layer 140 by patterning, thereby forming channels between the organic semiconductor layer 150 and the source and drain lines 130a and 130b. To form the openings 160a and 160b in the gate insulating layer 140, the gate insulating layer 140 is patterned using a photoresist pattern (not shown). As depicted in FIG. 2, the openings 160a and 160b can be formed by photolithography, for example using a half tone mask, but the present invention is not limited thereto.

After the openings 160a and 160b are formed in the gate insulating layer 140, the openings 160a and 160b are filled with conductive materials 170a and 170b. Nonlimiting examples of suitable conductive materials 170a and 170b include metals such as Ag, Mg, Al, Pt, Pd, Au, Ni, Nd, Ir, Cr, Cu, etc. According to one embodiment of the present invention, the conductive materials 170a and 170b can comprise a conductive paste containing Ag. Alternatively, the conductive materials 170a and 170b can comprise a conductive polymer. However, it is understood that the present invention is not limited thereto.

The conductive materials 170a and 170b filled in the openings 160a and 160b can be sprayed using an inkjet method, or can be deposited and then patterned by photolithography. However, the present invention is not limited thereto.

After the openings 160a and 160b are filled with the conductive materials 170a and 170b, the organic semiconductor layer 150 is formed. The organic semiconductor layer 150 can comprise pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivatives, oligocene of naphthalene and its derivatives, alpha-5-thiophene oligothiophene and its derivatives, phthalocyanine which includes or does not include a metal and its derivatives, naphthalene tetracarboxylic diimide and its derivatives, naphthalene tetracarboxylic dianhydride and its derivatives, pyromellitic dianhydride and its derivatives, pyromellitic diimide and its derivatives, conjugate polymers that include thiopene and its derivatives, and polymers that include fluorine and its derivatives.

After the organic semiconductor layer 150 is formed, the source and drain lines 130a and 130b are connected to the organic semiconductor layer 150 by forming source and drain electrodes 180a and 180b using a metal having a high work function. Nonlimiting examples of suitable such metals include Au, Pt, Pd, etc. As depicted in FIG. 2, the openings 160a and 160b where the channels will be formed is filled with the conductive materials 170a and 170b, thereby decreasing the risks of forming thin source and drain electrodes 180a and 180b or of disconnection of the source and drain electrodes 180a and 180b.

Figure 3:
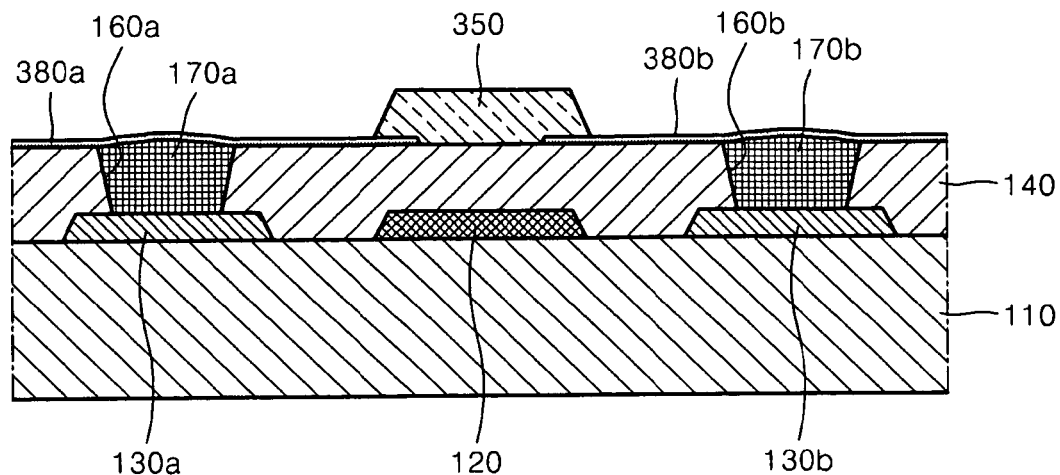
FIG. 3 is a cross-sectional view of an organic TFT according to another embodiment of the present invention.

FIG. 3 is a cross-sectional view of an organic TFT according to another embodiment of the present invention. In the embodiment depicted in FIG. 2, the source and drain electrodes 180a and 180b are formed after the organic semiconductor layer 150 is formed and the openings 160a and 160b are filled with the conductive materials 170a and 170b. However, in the embodiment depicted in FIG. 3, the organic semiconductor layer 350 is formed after the openings 160a and 160b are filled with the conductive material 170a and 170b and after the source and drain electrodes 380a and 380b are formed. In FIGS. 2 and 3, like reference numerals denote like elements.

Figure 4:
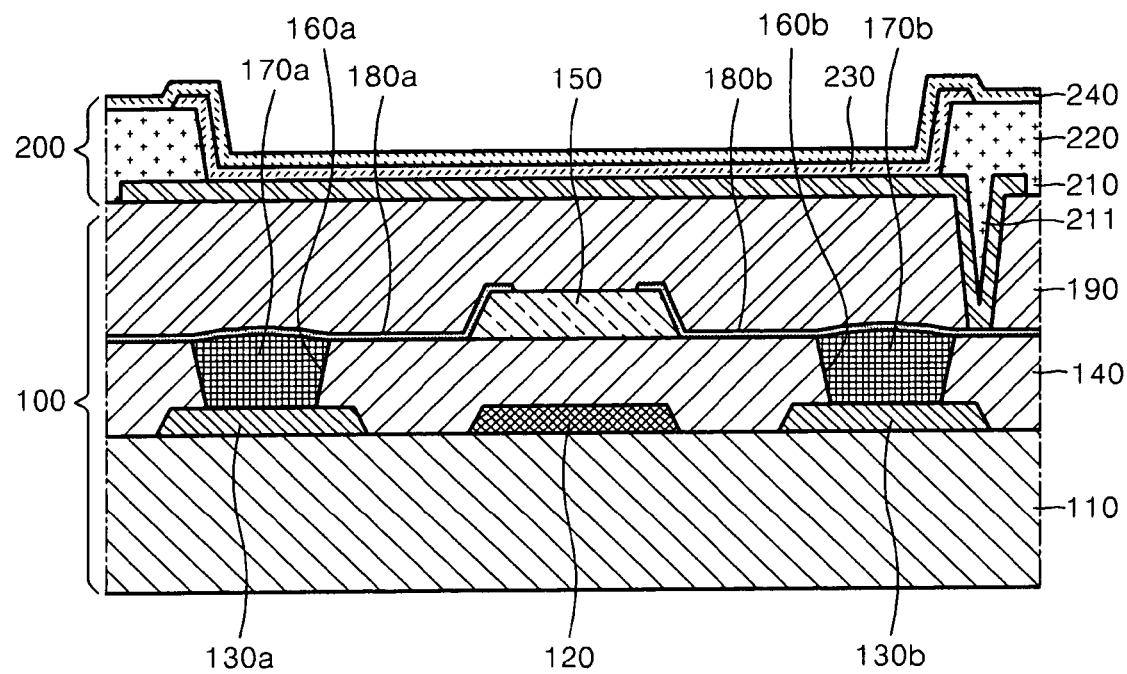
FIG. 4 is a cross-sectional view of a flat display apparatus including the organic TFT of FIG. 2.

FIG. 4 is a cross-sectional view of an organic electroluminescent device (OGLED) (which is one example of a pixel unit included in a flat display apparatus) having the organic TFT of FIG. 2. The OLED includes an organic TFT unit 100 and a pixel unit 200.

The organic TFT unit 100 includes a substrate 110, a gate electrode 120, source and drain lines 130a and 130b, a gate insulating layer 140 having patterned openings 160a and 160b filled with conductive materials 170a and 170b, an organic semiconductor layer 150, source and drain electrodes 180a and 180b electrically connecting the source and drain lines 130a and 130b to the organic semiconductor layer 150, and a protective layer 190. The organic TFT unit 100 (without the protective layer 190) is depicted in FIG. 2 and described in detail above.

The pixel unit 200 includes a first electrode layer 210, a pixel defining layer 220, an organic electroluminescent layer 230, and a second electrode layer 240.

In the TFT unit 100, after the openings 160a and 160b are formed and filled with the conductive materials 170a and 170b, the source and drain lines 130a and 130b, the source and drain electrodes 180a and 180b, and the organic semiconductor layer 150 are electrically connected. Then, the protective layer 190 (such as a passivation layer and/or a planarizing layer for insulating and/or planarizing the organic TFT unit 100) is formed on the source and drain electrodes 180a and 180b.

The first electrode layer 210 of the pixel unit is formed on the protective layer 190 of the TFT unit 100 and electrically connected to the organic TFT unit 100 via a through hole 211 formed in the protective layer 190.

The first electrode layer 210 can be formed in various configurations. For example, the first electrode layer 210 can be a transparent electrode formed of a transparent conductive material such as indium tin oxide (ITO), IZO, ZnO, or $In_2O_3$. If it is a top emission type, the first electrode layer 210 can also include a reflective electrode formed of Ag, Mg, Al, Pt, Pd, Au, Ni, Nd, Ir, Cr, or a compound of one of these metals, wherein the transparent electrode is formed on the reflective electrode. The first electrode layer 210 can have various structures, for example a single layer, a double layer, or multiple layers.

After the first electrode layer 210 is formed, the pixel defining layer 220 for defining pixel openings is formed on the first electrode layer 210. After the pixel defining layer 220 is formed, the organic electroluminescent layer 230 is formed at least in the regions including the pixel openings.

The organic electroluminescent layer 230 can be a low molecular weight organic film or a polymer organic film. When the organic electroluminescent layer 230 is a low molecular weight organic film, the organic electroluminescent layer 230 may include a hole injection layer (HIL), a hole transport layer (HTL), an emission layer (EML), an electron transport layer (ETL), and an electron injection layer (EIL). These layers may be stacked in a single structure or a composite structure. Nonlimiting examples of suitable materials for the layers include copper phthalocyanine (CuPc), N,N'-di (naphthalene-1-yl)-N,N'-diphenyl-benzidine (NPB), tris-8-hydroxyquinoline aluminum (Alq3), etc. The low molecular weight organic film can be formed by evaporation.

If the organic electroluminescent layer 230 is a polymer organic film, the organic electroluminescent layer 230 can include an HTL and an EML. Nonlimiting examples of suitable materials for the HTL include poly-(2,4)-ethylene-dihydroxy thiophene (PEDOT). Nonlimiting examples of suitable materials for the EML include poly-phenylenevinylene (PPV), soluble PPVs, cyano-PPVs, and polyfluorene. The HTL and EML can be formed by screen printing or inkjet printing.

The second electrode layer 240, like the first electrode layer 210, can be formed in various configurations according to the polarity of the electrodes and the emission type. That is, if the second electrode layer 240 is a cathode electrode in a bottom emission type display device, the second electrode layer 240 can comprise more than one layer using a metal having a low work function. Nonlimiting examples of suitable such metals include Li, Ca, LiF/Ca, LiF/Al, Al, Ag, Mg, and compounds compound of these metals. If the second electrode layer 240 is a top emission type display device, an electrode having a work function which is similar to or matches that of the organic electroluminescent layer 230 is formed on the organic electroluminescent layer 230 using a metal such as Li, Ca, LiF/Ca, LiF/Al, Al, Ag, Mg, or a compound of these metals. A transparent electrode formed of ITO, IZO, ZnO, or $In_2O_3$ can be formed on the electrode. The second electrode layer 240 can be formed on the entire surface of the pixel defining layer 220 and the organic electroluminescent layer 230, but is not limited thereto, and can have various configurations. In the above embodiment, the first electrode layer 210 is an anode electrode and the second electrode layer 240 is a cathode electrode. However, the first electrode layer 210 and the second electrode layer 240 can be formed in various configurations, and for example, the polarity of the first electrode layer 210 and the second electrode layer 240 may be reversed.

Figure 5:
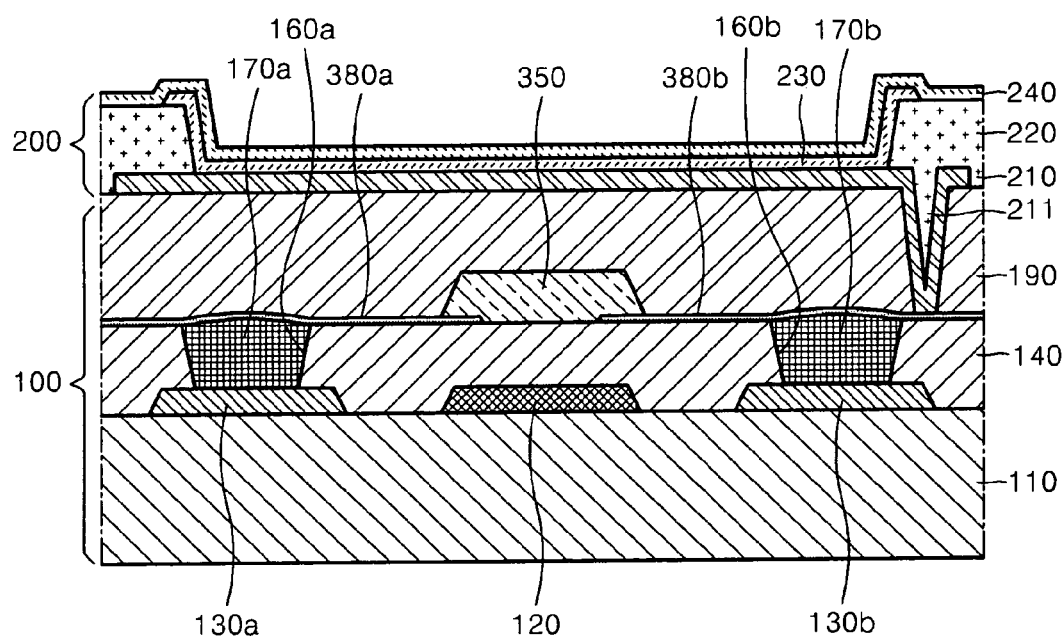
FIG. 5 is a cross-sectional view of a flat display apparatus including the organic TFT of FIG. 3.

FIG. 5 is a cross-sectional view of an OLED (which is an example of a pixel unit included in a flat display apparatus) having the organic TFT of FIG. 3. The OLED includes an organic TFT unit 100 and a pixel unit 200.

In the organic TFT unit 100 depicted in FIG. 4, after the organic semiconductor layer 150 is formed, the openings 160a and 160b are filled with the conductive materials 170a and 170b, and then the source and drain electrodes 180a and 180b are formed. However, in the organic TFT unit 100 depicted in FIG. 5, after the openings 160a and 160b are filled with the conductive materials 170a and 170b, the source and drain electrodes 380a and 380b are formed, and then the organic semiconductor layer 350 is formed. The remaining aspects of FIG. 5 are the same as those of FIG. 4.

The above embodiments are examples of the present invention, and do not limit the scope of the present invention. That is, the TFT according to the present invention can be used in various other applications as well as in organic electroluminescent display devices. For example, the inventive TFTs can be used in liquid crystal display devices. Also, the TFTs can be used in driver circuits on which images are not displayed as well as in flat display apparatuses.

According to the present invention, short circuits occurring between the channel connecting the source and drain lines and the organic semiconductor layer are prevented by filling the openings patterned in the gate insulating layer with a conductive material.

While exemplary embodiments of the present invention have been illustrated and described, it will be understood by those of ordinary skill in the art that various modifications and substitutions may be made to the described embodiments without departing from the spirit and scope of the present invention as defined by the accompanying claims.

What is claimed is:

1. An organic thin film transistor comprising:
    a substrate comprising at least one source line, at least one drain line, and at least one gate electrode;
    a gate insulating layer positioned on the source line, the drain line and the gate electrode, the gate insulating layer having openings for exposing the source line and the drain line;
    a conductive material in the openings of the gate insulating layer, wherein the conductive material contacts the source line and the drain line;
    an organic semiconductor layer electrically connected to the conductive material;
    at least one source electrode electrically connected to the source line through the conductive material in the openings in the gate insulating layer; and
    at least one drain electrode electrically connected to the drain line through the conductive material in the openings in the gate insulating layer.

2. The organic thin film transistor of claim 1, wherein the organic semiconductor layer is positioned on the gate insulating layer, wherein at least a portion of the source electrode and at least a portion of the drain electrode each overlap the organic semiconductor layer.

3. The organic thin film transistor of claim 1, wherein the source electrode and the drain electrode are each positioned on the gate insulating layer and the conductive material, and wherein the organic semiconductor layer is positioned on the gate insulating layer and on at least a portion of each of the source electrode and the drain electrode.

4. The organic thin film transistor of claim 1, wherein each of the source electrode and the drain electrode comprises a metal selected from the group consisting of Au, Pt, Pd and combinations thereof.

5. The organic thin film transistor of claim 4, wherein the conductive material comprises a conductive paste comprising a material selected from the group consisting of Ag, Mg, Al, Ni, Nd, Ir, Cr, Cu and combinations thereof.

6. The organic thin film transistor of claim 5, wherein the conductive material comprises a conductive polymer.

7. An organic electroluminescent device comprising:
the organic thin film transistor of claim 1; and
a pixel unit electrically connected to the thin film transistor, the pixel unit comprising:
   a first electrode layer having at least one through hole electrically connecting the first electrode layer to the thin film transistor;
   a pixel defining layer;
   an organic electroluminescent layer; and
   a second electrode layer.

8. The organic electroluminescent display of claim 7, wherein the thin film transistor further comprises a protective layer for insulating the thin film transistor from the pixel unit.

9. The organic thin film transistor of claim 1, wherein, at one location along the gate insulating layer, the gate insulating layer is positioned between at least one of the source line and the drain line and at least one of the source electrode and the drain electrode, respectively.

10. The organic thin film transistor of claim 1, wherein, at one location along the source electrode or the drain electrode, the gate insulating layer is positioned between the source electrode or the drain electrode and the gate electrode.

11. A method of manufacturing an organic thin film transistor comprising:
   forming at least one source line, at least one drain line and at least one gate electrode on a substrate;
   forming a gate insulating layer on the source line, the drain line and the gate electrode, the gate insulating layer having openings exposing the source line and the drain line;
   filling the openings in the gate insulating layer with a conductive material;
   forming an organic semiconductor layer over the gate insulating layer and the conductive material;
   forming at least one source electrode on the gate insulating layer and the conductive material such that the source electrode is electrically connected to the source line through the conductive material; and
   forming at least one drain electrode on the gate insulating layer and the conductive material such that the drain electrode is electrically connected to the drain line through the conductive material.

12. The method of claim 11, wherein the organic semiconductor layer is positioned on the gate insulating layer, wherein at least a portion of the source electrode and at least a portion of the drain electrode each overlap the organic semiconductor layer.

13. The method of claim 11, wherein the source electrode and the drain electrode are each positioned on the gate insulating layer and the conductive material, and wherein the organic semiconductor layer is positioned on the gate insulating layer and on at least a portion of each of the source electrode and the drain electrode.

14. The method of claim 11, wherein the source electrode and the drain electrode each comprise a metal selected from the group consisting of Au, Pt, Pd and combinations thereof.

15. The method of claim 14, wherein the conductive material comprises conductive paste comprising a material selected from the group consisting of Ag, Mg, Al, Ni, Nd, Ir, Cr, Cu and combinations thereof.

16. The method of claim 15, wherein the conductive material comprises a conductive polymer.

17. The organic thin film transistor of claim 1, wherein each opening has a cross section comprising at least two side walls formed by the gate insulating layer.

18. A flat display apparatus comprising:
an organic thin film transistor comprising:
   a substrate comprising at least one source line, at least one drain line, and at least one gate electrode,
   a gate insulating layer positioned on the source line, the drain line and the gate electrode, the gate insulating layer having openings for exposing the source line and the drain line,
   a conductive material in the openings of the gate insulating layer, wherein the conductive material contacts the source line and the drain line,
   an organic semiconductor layer electrically connected to the conductive material,
   at least one source electrode electrically connected to the source line through the conductive material in the openings in the gate insulating layer, and
   at least one drain electrode electrically connected to the drain line through the conductive material in the openings in the gate insulating layer; and
a display device electrically connected to the organic thin film transistor.

19. The flat display apparatus of claim 18, wherein the organic semiconductor layer of the thin film transistor is positioned on the gate insulating layer, wherein at least a portion of the source electrode and at least a portion of the drain electrode each overlap the organic semiconductor layer.

20. The flat display apparatus of claim 18, wherein the source electrode and the drain electrode are each positioned on the gate insulating layer and the conductive material, and wherein the organic semiconductor layer is positioned on the gate insulating layer and on at least a portion of each of the source electrode and the drain electrode.

21. The flat display apparatus of claim 18, wherein each of the source electrode and the drain electrode comprises a metal selected from the group consisting of Au, Pt, Pd and combinations thereof.

22. The flat display apparatus of claim 21, wherein the conductive material comprises a conductive paste comprising a material selected from the group consisting of Ag, Mg, Al, Ni, Nd, Ir, Cr, Cu and combinations thereof.

23. The flat display apparatus of claim 18, wherein the conductive material comprises a conductive polymer.

* * * * *